United States Patent [19]

Mrdjen

[11] 4,178,064
[45] Dec. 11, 1979

[54] REAL TIME GRATING CLOCK FOR GALVANOMETER SCANNERS IN LASER SCANNING SYSTEMS

[75] Inventor: Peter Mrdjen, Mountain View, Calif.

[73] Assignee: Xerox Corporation, Stamford, Conn.

[21] Appl. No.: 900,460

[22] Filed: Apr. 27, 1978

[51] Int. Cl.² .............................................. G02B 27/17
[52] U.S. Cl. ..................................... 350/6.6; 250/235
[58] Field of Search ................... 350/285, 6.6, 162 R, 350/144, 160 R, 161, 6.3, 6.9; 358/199, 208, 264; 250/237 G, 237 R, 232, 235, 236; 331/94.5; 356/169

[56] References Cited

U.S. PATENT DOCUMENTS

| | | | |
|---|---|---|---|
| 2,871,369 | 1/1959 | Williams | 250/236 |
| 3,573,849 | 4/1971 | Harriot | 346/108 |
| 3,774,121 | 11/1973 | Ashkin et al. | 331/94.5 |
| 3,833,808 | 9/1974 | Armond | 250/236 |
| 3,883,737 | 5/1975 | Throssell et al. | 350/6.3 |
| 3,924,107 | 12/1975 | Sakai | 250/236 |
| 3,995,110 | 11/1976 | Starkweather | 350/285 |
| 3,996,463 | 12/1976 | Jablonowski | 250/237 G |
| 4,032,888 | 6/1977 | Broyles et al. | 340/146.3 F |
| 4,079,252 | 3/1978 | Brake | 250/237 |

Primary Examiner—John K. Corbin
Assistant Examiner—B. W. de los Reyes
Attorney, Agent, or Firm—Irving Keschner

[57] ABSTRACT

A scanning system which utilizes a resonant mechanical oscillator, such as a galvanometer, to scan a laser beam across a surface of a medium responsive to said laser beam. The laser beam scan velocity across the surface normally would vary sinusoidally because of the resonant nature of the drive system. The data flow, or bit density, of information to be recorded on or read out from the surface, would have a corresponding sinusoidal variation. In order to compensate for this, a grating is provided adjacent the galvanometer and a second laser beam is simultaneously incident on the mirror portion of the rotating galvanometer. As the galvanometer is caused to oscillate, two scanning beams are generated, one scanning the surface and the other scanning across the grating. The grating is arranged to provide a plurality of timing or clocking pulses which are generated in response to the scanning thereof by the laser beam whereby in the writing mode, the writing laser beam is accurately clocked as it is modulated and in the read mode, the timing pulses matches the bit density of the output data, causing the data to be entered into a storage device at the proper time sequence.

8 Claims, 4 Drawing Figures

REAL TIME GRATING CLOCK FOR GALVANOMETER SCANNERS IN LASER SCANNING SYSTEMS

BACKGROUND OF THE INVENTION

In recent years, laser scanning systems have been proposed which are capable of scanning a record medium such as a document in a read mode of operation or to record information on a laser sensitive medium in a write mode of operation. The prior art systems have generally utilized a multifaceted rotating polygon which is driven at a constant speed. However, the large degree of accuracy necessitated and machine tolerance required in grinding and polishing each of the facets to avoid errors which can be caused by misaligned facets have made the cost of such multifaceted polygons relatively expensive. Manufacturers of such scanning systems have sought, usually unsuccessfully, alternate ways of manufacturing the multifaceted polygons at reduced cost. In order to minimize facet induced system erors, additional optics associated with the rotating polygon has been provided. However, this also adds to the cost and complexity of the system.

An alternative type of scanning device which can be utilized is a galvanometer or other type of mechanical oscillating mirror devices. If the galvanometer is utilized in its linear mode of operation, i.e. it is driven by a ramp current pulse, its low scanning speed and the increased cost due to the requirement of providing the ramp current pulse makes its use relatively inefficient. Much higher speeds can be achieved with galvanometers if they operate in a resonating mode. However, the sinusoidal variations in the scanning velocity, unless compensated, will result in nonuniformity in the data flow, or bit density, (resolution) of the data in the read and write modes of operation. The galvanometer mirror generally would have a slow angular velocity towards the end portion of its displacement and a faster angular velocity during the middle portion. Obviously, these nonlinearities produce corresponding nonlinearities in the scanning velocity of the beam.

SUMMARY OF THE PRESENT INVENTION

The present invention provides a scanning system which enables mechanical oscillators, such as a galvanometer, to operate in a resonant mode in scanning a laser beam across a surface, the surface being either a record medium, such as a document (read mode) or a laser sensitive surface, such as film or a xerographic surface (write mode). The laser beam scan velocity across the document or laser-sensitive surface normally would vary sinusoidally because of the resonsant nature of the drive system. The data flow, or bit density, of the information to be written or read, unless compensated, would also have a corresponding sinusoidal variation. In order to compensate for this, a grating is provided adjacent the galvanometer and a second laser beam is simultaneously incident on the mirror portion of the rotating galvanometer. As the galvanometer is caused to oscillate, two scanning beams are generated, one scanning the surface and the other scanning across the grating. The grating is arranged to provide a plurality of timing or clocking pulses wihch are generated in response to the scanning thereof by the laser beam whereby in the write mode, the laser beam is accurately clocked as it is modulated and in the read mode, the timing pulses match the bit density of the output data, causing the data to be entered into a storage device at the proper time sequence.

It is an object of the present invention to provide a laser scanning system which utilizes a mechanical oscilaltor operating in a resonant mode.

It is a further object of the present invention to provide a laser scanning system which utilizes a galvanometer operating in a resonant mode to scan a laser beam across a surface, the sinusoidal variation in the velocity of the scanning laser beam being compensated for by using a grating clock to generate accurate timing or clocking pulses.

BRIEF DESCRIPTION OF THE DRAWINGS

For a better understanding of the invention as well as other objects and further features thereof, reference is made to the following description which is to be read in conjunction with the accompanying drawings wherein.

DETAILED DESCRIPTION OF THE PREFERRED EMBODIMENT

Figure 1:
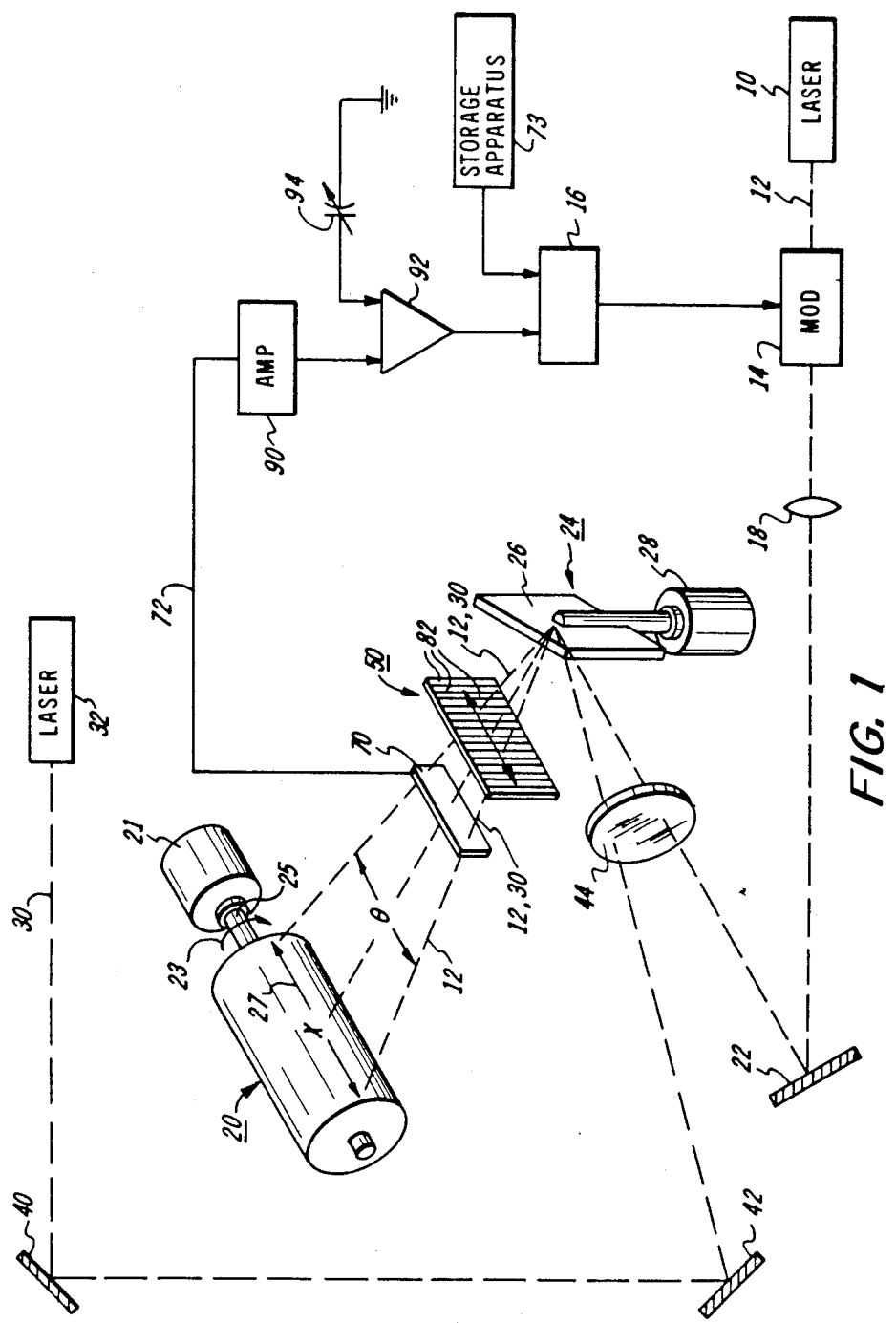
FIG. 1 is a partial perspective view illustrating one embodiment of the present invention showing a laser scanning system in the write mode.

FIG. 1 shows the scanning system of the present invention being utilized in a write mode of operation. It should be noted that U.S. Pat. No. 3,867,571 for example, illustrates a typical laser flying spot scanner which utilizes a xerographic medium for recording (writing) information thereon. Since some of the functions and elements of the present invention are similar to those disclosed in this patent, any teachings therein necessary for the understanding of the present invention are incorporated herein by reference. Although a drum having a xerographic photoreceptor formed thereon is the preferred writing or recording medium, other mediums can be utilized including laser sensitive film. A laser 10, such as a helium-cadmium laser, generated a laser beam 12 which is incident on a modulator 14. Modulator 14 is controlled by the output of a processor 16 which will be described in more detail hereinafter. In general, the processor 16 controls modulator 14 in a manner whereby the beam 12, as it is caused to scan across a writing medium in a first, or X direction, is modulated in a manner wherein desired information is reproduced on the laser sensitive medium. The modulated output from modulator 14 enters lens 18 which is utilized to collimate and focus the modulated beam onto a laser-sensitive medium 20 via mirror 22 and oscillating mirror 26 of line scanner 24. Preferably, medium 20 comprises a xerographic photoreceptor formed on a drum shaped support member as described in the aforementioned patent. The drum is driven by motor 21 via shaft 25, the drum being rotated in the direction of arrow 23. It is noted that the nonlinearity of the scanning velocity of laser beam 12 on medium 20 originates in line scanner 24 which is a mechanical oscillator 28 of the torsion bar type with electromagnetic drive and pickup having a stable natural resonant frequency. In the preferred embodiment, line scanner 24 is a galvanometer. The mechanical oscillator 28 drives a pivoting line-directing device such as mirror 26 which is mounted on the torsion bar and reflects the focused beam thereon across a scan, or deflection, angle $\theta$ causing the writing dot (or laser beam) to scan back and forth in the X direction across a scan line 27 on the xerographic photoreceptor 20. The angular displacement of mirror 26 varies sinusoidally due to the resonant nature of mechanical oscillator 28, a characteristic well known in the scanning art. Mirror 26 has a slower angular velocity towards the end portion of the displacement in the X-direction and a faster angular velocity during the middle portion. These nonlinearities produce corresponding nonlinearities in the scanning velocity of laser beam 12 which are to be compensated in order to accurately reproduce information in accordance with the modulation of laser beam 12.

Figure 3:
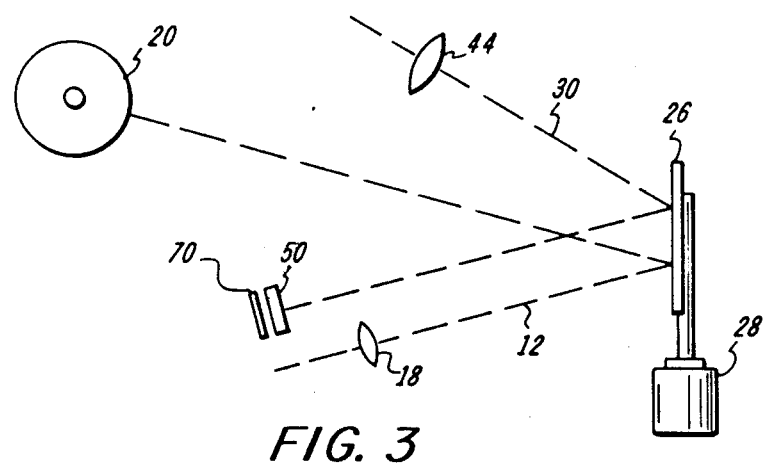
FIG. 3 is a view illustrating two laser beams being simultaneously incident on the mirror portion of the resonant mechanical oscillator and the refelction of one of the beams to a laser sensitive medium and the other beam to a grating.
Figure 4:
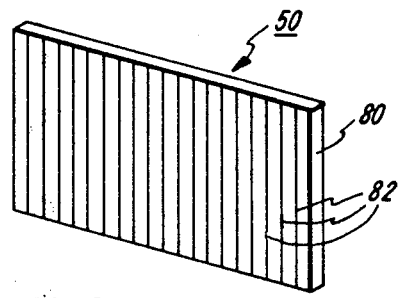
FIG. 4 illustrates a typical grating which can be utilized in the present invention to generate timing or clocking pulses.

As set forth hereinabove, notwithstanding any problems associated with using galvanometer mechanical oscillators operating in a resonant mode, they have other advantages over rotating multifaceted polygons which makes their use advantageous. Typically, galvanometers can be operated at extremely high speeds when in a resonant mode, and they provide diffraction limited performance with no beam truncation (and therefore better resolution capabilities) at lower laser power output requirements and allows the optics associated with a galvanometer scanner system to be simplified when compared to that utilized in system incorporating a rotating polygon. In accordance with the teachings of the present invention, a second laser beam 30, such as that generated by a laser 32 which may, for example, be a helium-neon laser, is directed to mirror 26 via mirrors 40 and 42 and lens 44, lens 44 focusing laser beam 30 onto a fine grating or coding plate 50. The focal length of lens 44 is preferably selected to be about an order of magnitude below the focal length of lens 18, which makes the corresponding scan length of grating 50 correspondingly smaller (it should be noted that although beams 12 and 30 may be incident on the surface of mirror 26 at the same spot, the system can by arranged such that the beams can be incident at different spots aligned along the axis of rotation mirror 26, as shown in FIG. 3, if the bending angles of the mirrors 22, 40 and 42 are appropriately selected). Thus, for example, for a 10-inch scan of laser sensitive medium 20, the grating scan is approximately one inch. Since both the laser beams are incident on the rotational axis of mirror 26 and are arranged optically to be incident on reflecting mirror 26 at substantially the same angle, substantially the same angle of scan $\theta$ is provided across laser sensitive medium 20 as that across grating 50. Beam 12 does not go through lens 44 as shown in FIG. 1 (and 2) but a perspective view would show lens 44 either below or above lens 18. A light detector 70 is placed behind the grating 50, with the light detector being a silicon detector or low-cost photomultiplier tube which generates clock pulses on the output lead 72. FIG. 4 shows a typical grating which comprises a transparent substrate 80 having a plurality of opaque markings 82 formed thereon. The clock pulses generated by the light detector 70 when the scanning laser beam 30 scans the grating markings are amplified by amplifier 90 and coupled to a comparator 92 wherein a threshold provided by voltage source 94 can provide a reference level voltage which is adjustable to provide a predetermined sensitivity adjustment to system noise. In any event, the output of amplifier 92 is a series of timing or clocking pulses generated simultaneously with the scanning of the photoreceptor drum 20 and compensates for the nonlinearity in the velocity of the scanning beam produced by line scanner 24. In other words, the clock pulses are only produced when the scanning beam 30 traverses the surface of grating 50, the pulse frequency being directly related to the velocity of the scanning beam 30 (and 12). The clock pulses leaving the comparator 92 are applied to a processing unit 16, the processing unit 16 controlling the flow of data bits, or bit density, applied to its other input, for example, from storage apparatus 73 into the modulator 14. If the grating utilized has a spatial frequency of 100 lines per millimeter, this will result in a possible resolution of 10 spots per millimeter on the surface of photoreceptor 20 (and the output document reproduced therefrom) which, in most applications, is adequate. This mode of operation compensates for the nonlinear scan of the galvanometer since data is written along scan line 27 at a uniform rate of resolution due to the clocking pulses generated via grating 50.

Figure 2:
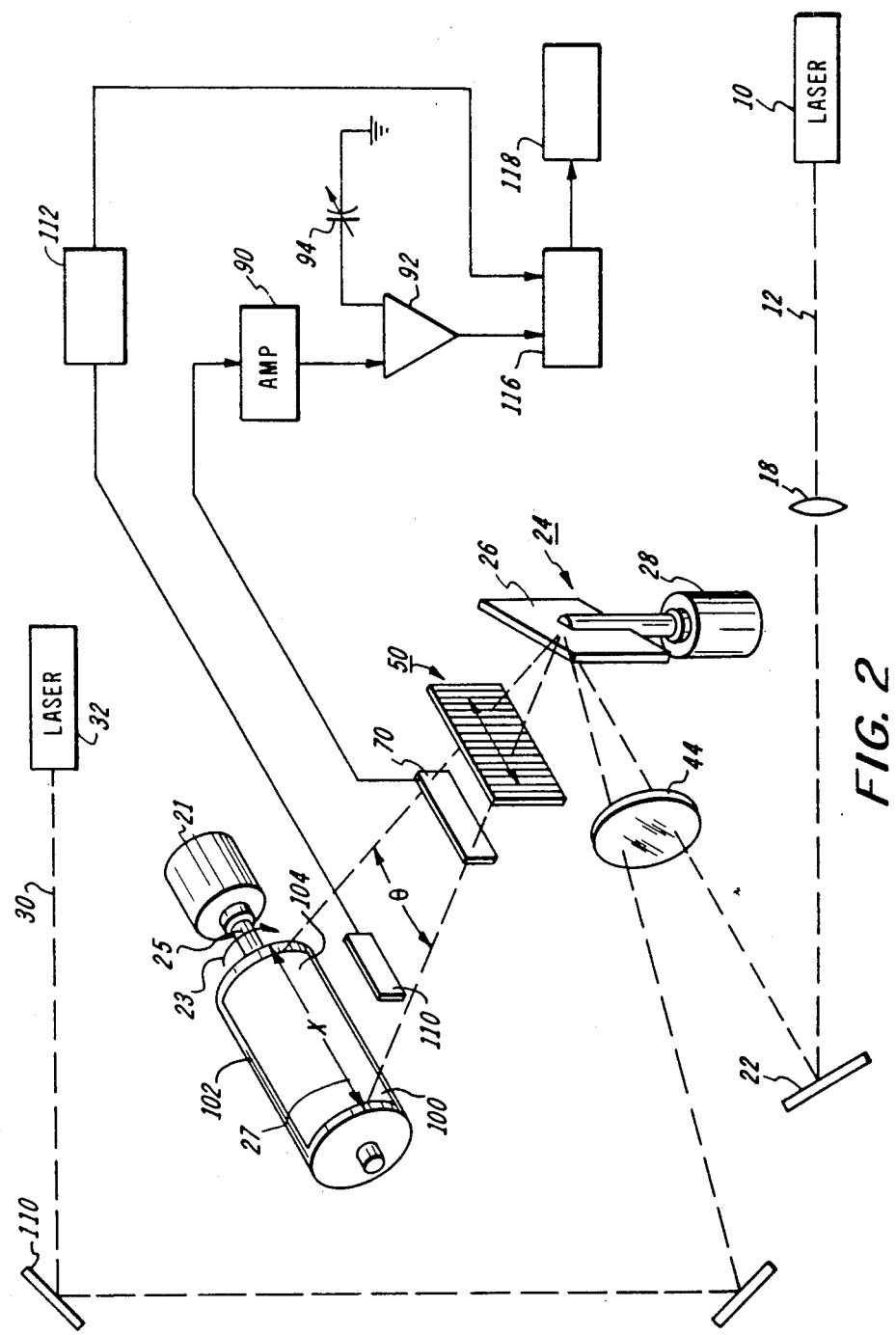
FIG. 2 is a partial perspective view of an alternate embodiment of the present invention showing the laser scanning system in the read mode.

FIG. 2 is similar to FIG. 1 except that the system is used to read information from a record medium 100 such as a document. For example, a document 100 can be placed about a drum 102 and scanned in the X-direction in a similar manner as photoreceptor 20 in FIG. 1 was scanned. In this case, the beam is focused into a small reading spot which is scanned across the image 104 on the record medium 100, light from the reading spot being reflected or absorbed by the image 104 on document 100. The reflected portion is intensity modulated in accordance with the image 104 and light-sensing devices such as photomultiplier 110 detects the reflected light and provides video analog signals representative of the image 104. The video signals can be digitized by analog to digital converter 112, the digital output signal, in this case, being applied to a storage device 116 for subsequent processing, the output signal being clocked into storage device 118 in a linear manner as determined by the output pulses from grating 50. In order to reproduce this stored output signal, the output from storage device 118 is connected to a laser scanning system operating in a write mode as shown in FIG. 1 (storage device 118 corresponding to storage apparatus 73). Although the writing and read modes of operation of a laser scanning system are shown separately in FIGS. 1 and 2, respectively, it should be noted that a single system which can be switched between read and write modes may be provided.

The output of the grating 50 is utilized to maintain proper synchronism between the writing beam modulation and writing beam scan (in the write mode) such that each information bit modulates the writing beam at precisely the proper instant with respect to the writing beam scan notwithstanding the sinusoidal variation in scan produced by line scan device 24. In the arrangement shown, both the output from the grating and the laser beam for scanning the photoreceptor are in synchronism. The grating comprises a succession of alternately opaque strips 82, as shown in FIG. 4, formed on the transparent substrate 80. Because of the variable transmission through the grating, the light intensity on the light detector 70 varies with time and the light detector 70 releases an electrical coding signal to the processing circuit 16. The width of the opaque and transparent strips of the grating are arranged such that they each correspond to a location by which a single bit (or a string of bits) of writing beam information is transferred to the xerographic photoreceptor 20 by the scanning laser beam. Accordingly, the processing circuit 16 is designed such as to release a single bit of information to the optical modulator 14 in response to one voltage pulse from the light detector 70. The design of the processing circuit 16 to accomplish the function described is well within the ordinary skill of the worker in the art and may comprise a shift register containing a train of information pulses which is gated by each pulse of the coding signal to release an information bit to the modulator 14. An appropriate counter and a "buffer store" device may be used for controlling transmission of the information from the storage apparatus 73 to the shift register.

In a similar manner, the output of the grating 50 is utilized to store information in storage device 116 as shown in FIG. 2 in desired time sequence to compensate for the sinusoidal variation in scanning velocity in the read mode of operation.

Motor 21, it should be noted, rotates the xerographic drum 20 (or drum 102) in the direction of arrow 23 to provide for scanning in the Y-direction whereby a two-dimensional scan of the writing or recording medium is provided.

FIG. 3 illustrates beams 12 and 30 incident simultaneously on the surface of mirror 26. The figure shows beam 30 incident on mirror 26 above beam 12 although the system can be arranged for beam 12 to be above beam 30 or for the beams to be incident at the same spot, as shown in FIG. 1. The figure also shows that the reflection of the beams from the surface of mirror 26, by appropriate positioning of the system components, is such that reflected beam 12 is only incident on laser sensitive medium 20 whereas reflected beam 30 is only incident on grating 50 while the beams are simultaneously scanning substantially the same scanning angle θ.

While the invention has been described with reference to its preferred embodiments, it will be understood by those skilled in the art that various changes may be made and equivalents may be substituted for elements thereof without departing from the true spirit and scope of the invention. In addition, many modifications may be made to adapt a particular situation or materials to the teachings of the invention without departing from its essential teachings.

What is claimed is:

1. Reproduction apparatus comprising:
   first laser means for generating a writing light beam,
   means for modulating said light beam,
   a medium sensitive to said light beam and to modulations thereof,
   galvanometer means having a sinusoidal displacement characteristic for causing said light beam to scan the sensitive medium at a predetermined scanning rate, said galvanometer means oscillating in a resonant mode, and
   means for controlling the modulation of the beam with respect to said scanning rate comprising second laser means for generating a timing light beam, said galvanometer means causing the timing beam to scan a timing means in synchronism with the writing beam, and means responsive to transmission of said timing light beam through the timing means and adapted to release timing signals in response thereto, said timing signals being coupled to said modulating means whereby said modulated light beam is reproduced on said sensitive medium in a manner whereby the nonlinear scan of said galvanometer means is compensated.

2. The reproduction apparatus of claim 1 wherein said writing light beam and said timing light beam are simultaneously incident on said galvanometer means and wherein the angle of scan across said timing means and the angle of scan across said sensitive medium are substantially equal.

3. The reproduction apparatus as defined in claim 6 further including first lens means interposed between said first laser means and said galvanometer means for focusing said first laser beam onto said sensitive medium and second lens means interposed between said second laser means and said galvanometer means for focusing said second laser beam onto said timing means.

4. The reproduction apparatus of claim 3 wherein the focal length of said first lens means is greater than the focal length of said second lens means.

5. The scanning apparatus of claim 2 wherein the focal length of said first lens means is greater than the focal length of said second lens means.

6. Apparatus for scanning an information bearing medium comprising:
   first laser means for generating a scanning light beam,
   an information bearing medium sensitive to said scanning light beam, said scanning light beam being reflected from said medium intensity modulated in accordance with the information contained on said information bearing medium,
   means for generating electrical signals in response to said intensity modulated light beam,
   galvanometer means having a sinusoidal displacement characteristic for causing said scanning light beam to scan said information bearing medium at a predetermined scanning rate, said galvanometer means oscillating in a resonant mode, and
   means for controlling the clocking of said electrical signals into storage means with respect to said scanning rate comprising second laser means for generating a timing light beam, said galvanometer means causing the timing beam to scan a timing means in synchronism with the scanning beam, and means responsive to transmission of said timing light beam through the timing means and adapted to release clocking signals in response thereto, said clocking signals being coupled to said storage means whereby said electrical signals are stored in said storage apparatus in a manner whereby the nonlinear scan of said galvanometer means is compensated.

7. The scanning apparatus of claim 6 wherein said scanning light beam and said timing light beam are simultaneously incident on said galvanometer means and wherein the angle of scan across said timing means and the angle of scan across said medium are substantially equal.

8. The scanning apparatus as defined in claim 7 further including first lens means interposed between said first laser means and said galvanometer means for focusing said first laser beam onto said medium and second lens means interposed between said second laser means and said galvanometer means for focusing said second laser beam onto timing means.

* * * * *